(12) United States Patent
Angyal et al.

(10) Patent No.: US 7,544,609 B2
(45) Date of Patent: Jun. 9, 2009

(54) METHOD FOR INTEGRATING LINER FORMATION IN BACK END OF LINE PROCESSING

(75) Inventors: Matthew S. Angyal, Stormville, NY (US); Habib Hichri, Poughkeepsie, NY (US); Christopher J. Penny, Poughkeepsie, NY (US); David K. Watts, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 11/673,276

(22) Filed: Feb. 9, 2007

(65) Prior Publication Data

US 2008/0194099 A1    Aug. 14, 2008

(51) Int. Cl.
*H01L 21/4763* (2006.01)
(52) U.S. Cl. ............... 438/643; 438/637; 257/E21.584
(58) Field of Classification Search ............... 438/643, 438/637, 675
See application file for complete search history.

(56) References Cited

U.S. PATENT DOCUMENTS

| | | | | |
|---|---|---|---|---|
| 5,592,024 A | * | 1/1997 | Aoyama et al. | 257/751 |
| 6,107,687 A | * | 8/2000 | Fukada et al. | 257/762 |
| 6,157,081 A | | 12/2000 | Nariman et al. | |
| 6,358,832 B1 | | 3/2002 | Edelstein et al. | |
| 6,468,906 B1 | | 10/2002 | Chan et al. | |
| 6,893,959 B2 | | 5/2005 | Barth | |
| 6,905,964 B2 | | 6/2005 | Lim et al. | |
| 7,078,796 B2 | | 7/2006 | Dunn et al. | |

\* cited by examiner

*Primary Examiner*—Phat X Cao
*Assistant Examiner*—Nga Doan
(74) *Attorney, Agent, or Firm*—Cantor Colburn LLP; Rosa Suazo

(57) ABSTRACT

A method for integrating cap liner formation in back-end-of-line (BEOL) processing of a semiconductor device includes forming a trench structure within an insulating layer of the semiconductor device, depositing a first liner material over a top surface of the insulating layer, including sidewall and bottom surfaces of the trench, and partially filling the trench with a wiring metal material to a height corresponding to a final intended line height. A second liner material is over the wiring metal material, and a sacrificial fill material is formed over the second liner material. The sacrificial fill is planarized down to the level of the second liner material over the wiring metal material partially filling the trench, wherein a remaining portion of the second liner material defines a cap liner of the wiring metal.

20 Claims, 4 Drawing Sheets

METHOD FOR INTEGRATING LINER FORMATION IN BACK END OF LINE PROCESSING

BACKGROUND

The present invention relates generally to semiconductor device processing techniques and, more particularly, to a method for integrating liner formation in back end of line (BEOL) processing.

Metallization patterns on integrated circuits may be formed by depositing a dielectric layer, patterning the dielectric layer by photolithography and reactive ion etching (RIE) to form a groove or trench, and depositing a metal layer that fills the trench in the dielectric layer. The metal layer typically not only fills the trenches but also covers the entire semiconductor wafer. Thereafter, the excess metal is removed using either chemical-mechanical polishing (CMP) or an etch back process so that only the metal in the trenches remains.

This technique, also referred to as "damascene" processing in the art, thus forms inlaid conductors in the dielectric layer. Damascene processing (an additive process) avoids the problems associated with metal etching (a subtractive process), such as, for example, the lack of suitable dry-etch plasma chemistries, problems in dimension control, the formation of small gaps that are difficult to fill with the subsequent dielectric layer, and the entrapment of impurities in inter wiring spaces.

As wire widths in integrated circuits continue to shrink, the electrical conductivity of the wiring material becomes increasingly more important. The initial material of choice since the early days of integrated circuit manufacturing (i.e., aluminum) is becoming less attractive than other materials, such as gold, copper, and silver, which are better conductors. In addition to possessing superior electrical conductivity, such materials are more resistant than aluminum to electromigration, a property that increases in importance as wire cross-sectional areas decrease and applied current densities increase. In particular, copper is seen as a particularly attractive replacement for aluminum as copper offers low cost, ease of processing, lower susceptibility to electromigration, and lower resistivity.

On the other hand, copper has several disadvantages compared to aluminum. For example, copper can diffuse rapidly into and through silicon substrates and dielectric films, such as silicon dioxide. In turn, diffusion of copper into an adjacent dielectric region can cause formation of a conductive path between two interconnect lines, thereby producing an electrical short. Furthermore, diffusion into an adjacent silicon substrate can cause junction leakage, even destroying the device. Copper is easily oxidized during subsequent processing steps, but, unlike aluminum, does not have a hard, stable, self-limited native oxide. Copper also has poor adhesion to capping dielectric layers. Accordingly, the successful replacement of aluminum with copper as an interconnect material requires that such problems be overcome.

In this regard, cap (top surface) liners (e.g., tantalum, titanium based) can be used in combination with trench bottom and sidewall liners in order to encapsulate the copper fill and prevent diffusion of the copper into the surrounding dielectric material in the BEOL areas of the device. Conventionally, such cap liners are formed post-CMP, such as by implementing a selective process to apply the liner material to the top of the copper lines after polishing. Alternatively, cap liners may be formed by blanket deposition of the liner material, followed by selective recession over the insulating layer underneath. In either case, there is the potential for hard shorts within the wiring layers due to the presence of residual liner metal in unwanted regions of the device. Accordingly, it would be desirable to be able to form the cap liner material in a more integrated manner with respect to the damascene process itself, so as to avoid the need for cap liner formation following initial planarization of the wiring metal.

SUMMARY

The foregoing discussed drawbacks and deficiencies of the prior art are overcome or alleviated by a method for integrating cap liner formation in back-end-of-line (BEOL) processing of a semiconductor device, including, in an exemplary embodiment, forming a trench structure within an insulating layer of the semiconductor device; depositing a first liner material over a top surface of the insulating layer, including sidewall and bottom surfaces of the trench; partially filling the trench with a wiring metal material, to a height corresponding to a final intended line height; depositing a second liner material over the wiring metal material; forming a sacrificial fill material over the second liner material; and planarizing the sacrificial fill material down to the level of the second liner material over the wiring metal material partially filling the trench; wherein a remaining portion of the second liner material defines a cap liner of the wiring metal.

In another embodiment, a method for integrating cap liner formation in back-end-of-line (BEOL) processing of a semiconductor device includes forming a trench structure within an insulating layer of the semiconductor device; depositing a first liner material over a top surface of the insulating layer, including sidewall and bottom surfaces of the trench; partially filling the trench with a wiring metal material, to a height corresponding to a final intended line height, the wiring metal material also being formed over horizontal surfaces of the insulating layer above the trench; depositing a second liner material over the wiring metal material; forming a sacrificial fill material over the second liner material; and planarizing the sacrificial fill material down to the level of the second liner material over the wiring metal material partially filling the trench by chemical mechanical polishing (CMP); wherein a remaining portion of the second liner material following the CMP defines a cap liner of the wiring metal.

TECHNICAL EFFECTS

As a result of the summarized invention, a solution is technically achieved in which an integrated cap liner process is used so as to expose the top of the cap liner following the initial CMP portion of damascene processing, thereby eliminating the need for selective liner deposition on polished metal lines post-CMP.

BRIEF DESCRIPTION OF THE DRAWINGS

Referring to the exemplary drawings wherein like elements are numbered alike in the several Figures.

DETAILED DESCRIPTION

Disclosed herein is a method for integrating cap liner formation in BEOL processing such that the cap liner is exposed following CMP processing. Briefly stated, an initially formed trench (or via/trench combination for dual damascene) is partially filled with conductive metal to an intended final line height, after initial liner and seed deposition over the sidewalls and bottom surface of the trench. Then, prior to the initial CMP of the metal fill, a cap liner is formed over the top surface of the metal in the partially filled trench. After a subsequent formation of sacrificial overburden material over the cap liner, the resulting structure is polished down to the top of the cap liner at the intended line height. Thereby, the formation of the cap liner is complete after the initial CMP process, eliminating the need for selective plating and/or additional CMP processing before the next dielectric layer is formed.

Figure 1:
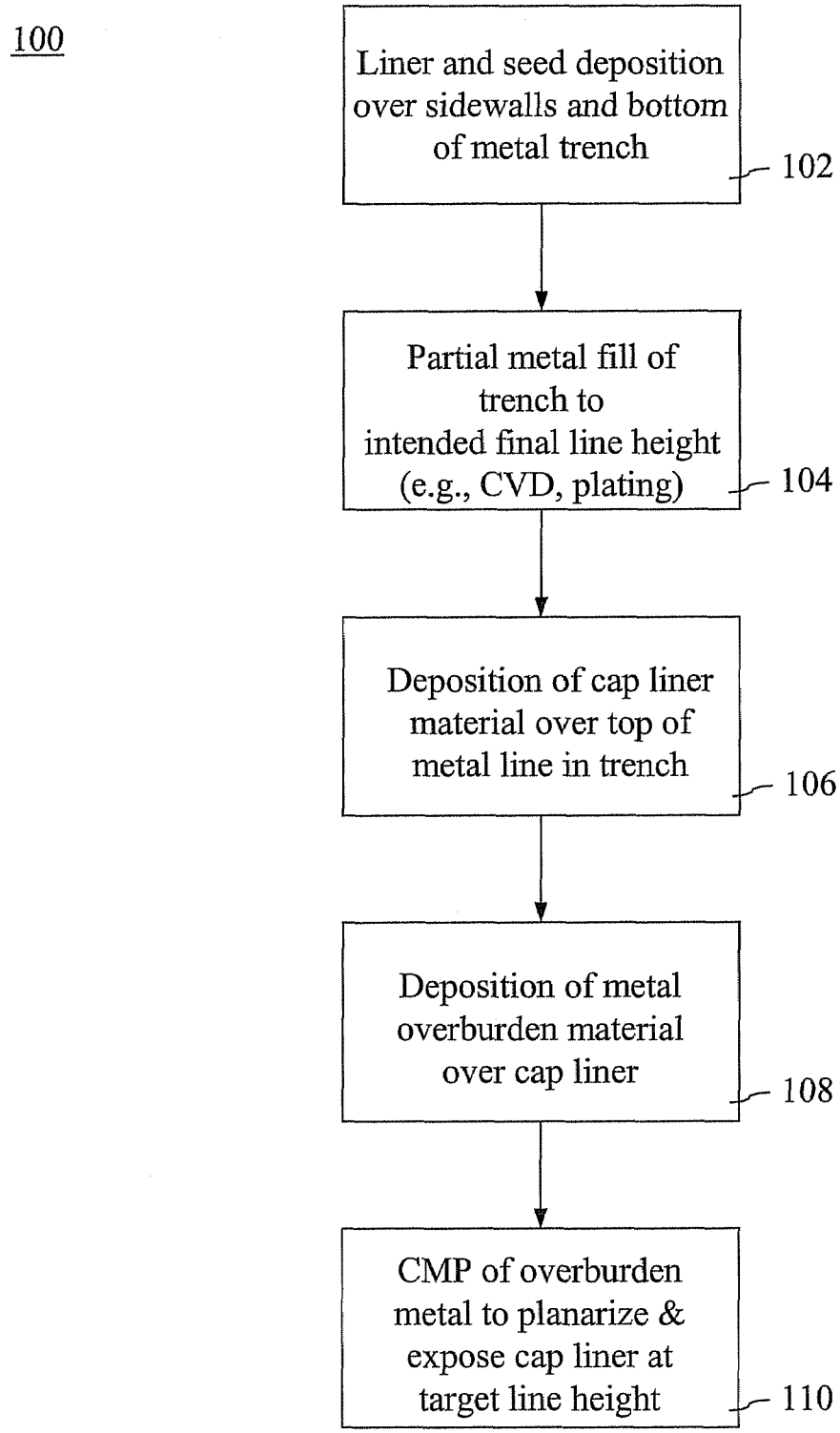
FIG. 1 is process flow block diagram illustrating a method for integrating liner formation in back end of line (BEOL) processing, in accordance with an embodiment of the invention.

Referring to both FIG. 1 and the cross-sectional views of FIGS. 2(a) through 2(e), there is illustrated a method for integrating cap liner formation in BEOL processing, in accordance with an embodiment of the invention. FIG. 1 generally outlines an exemplary process flow in block 102 through 110, while FIGS. 2(a) through 2(e) are a sequence of cross-sectional views of a semiconductor device depicting an exemplary processing application of the method illustrated in FIG. 1.

Figure 2A:
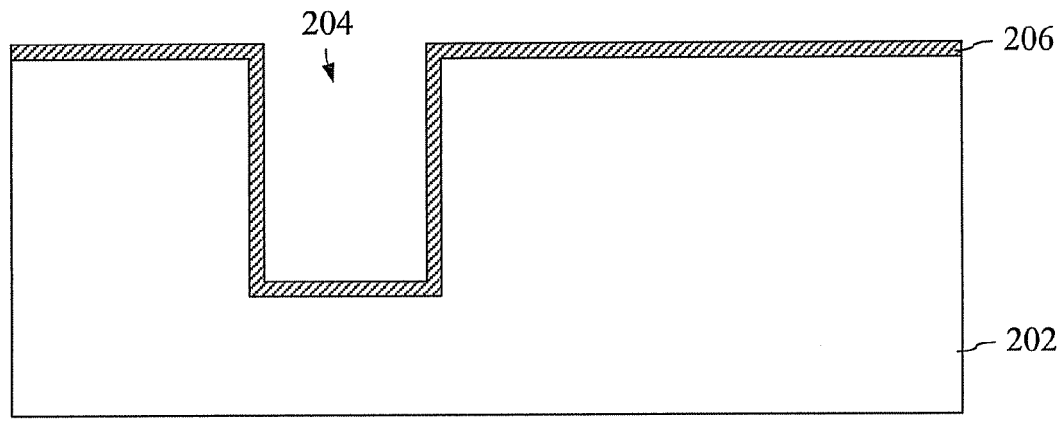
FIGS. 2(a) through 2(e) are a sequence of cross-sectional views of a semiconductor device depicting an exemplary processing application of the method illustrated in FIG. 1.
Figure 2B:
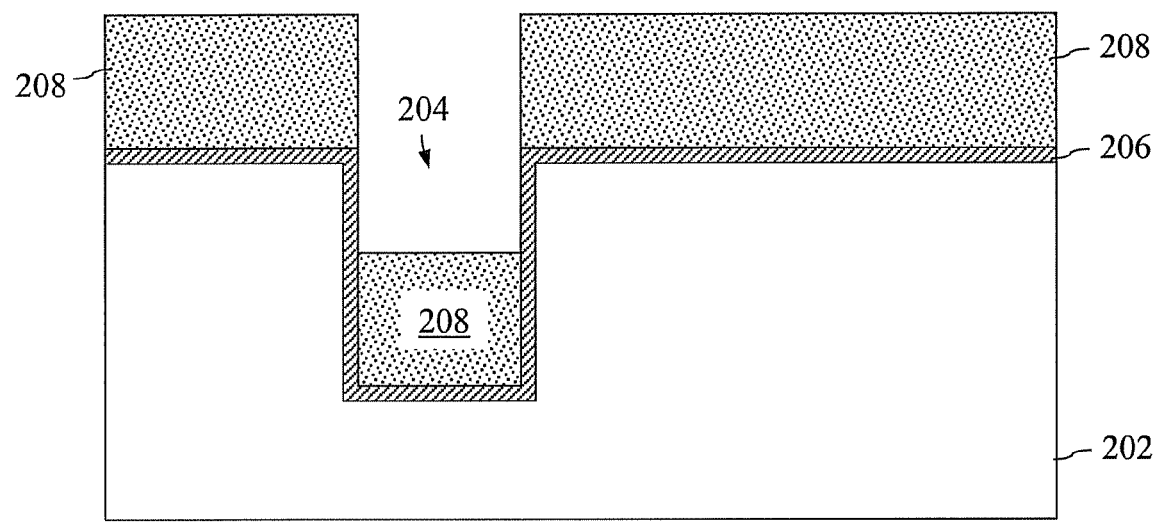
Figure 2C:
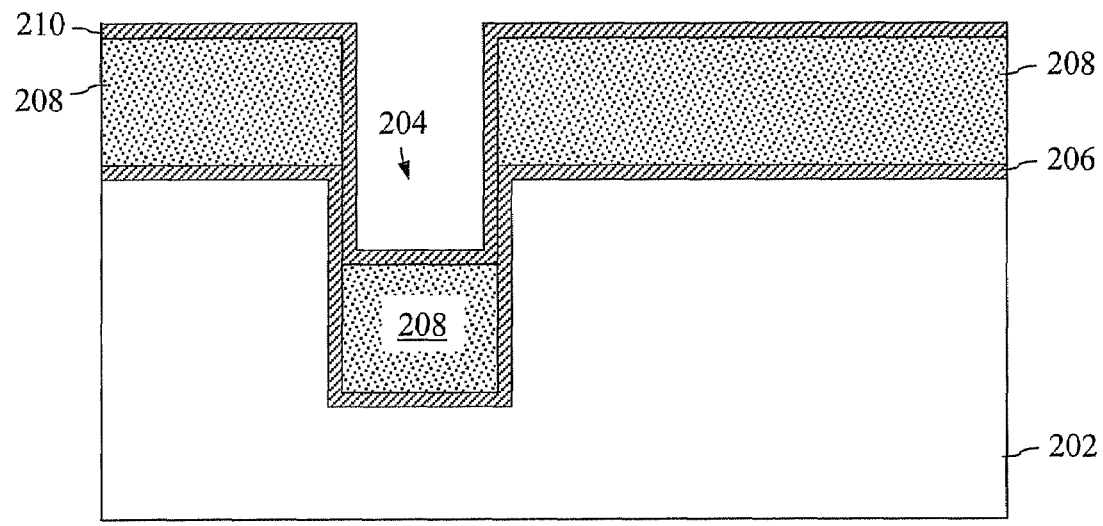
Figure 2D:
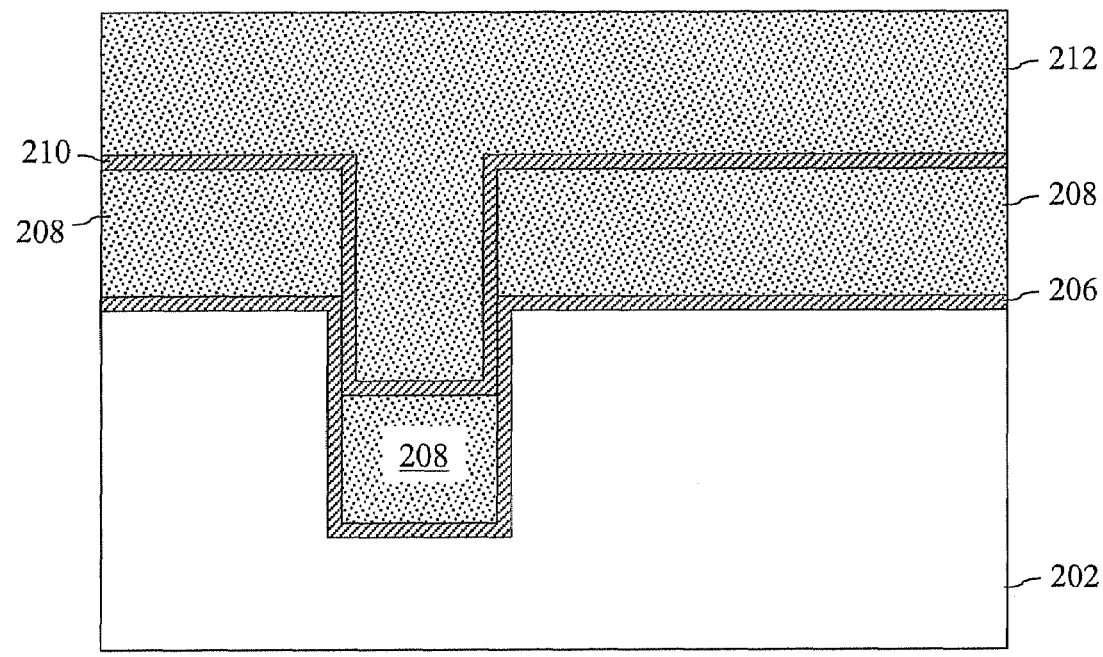

As initially shown in block 102 of FIG. 1 and in FIG. 2(a), an insulating layer 202 (e.g., oxide, low-k material) has a trench 204 patterned therein. This may represent a specific wiring level within a semiconductor device, or a first wiring level connecting to an active area of a semiconductor substrate. In any event, a seed and liner material deposition is depicted generally by layer 206, so as to cover the top surface of the insulating layer 202 and sidewalls and bottom surface of the trench 204. As known in the art, exemplary liner materials may include tantalum (Ta), tantalum nitride (TaN) or titanium nitride (TiN), among others.

In conventional metal processing, the trench 204 would be overfilled at this point by a conductive material such as copper, followed by a planarization (CMP) step to the top of the insulating layer 202. However, the trench metal would still require a top liner for diffusion purposes (only being protected by sidewall and bottom liner material at this point), leading to the difficulties discussed above. Accordingly, as reflected in block 104 of FIG. 1 and shown in FIG. 2(b), the trench is partially filled with conductive metal 208 (e.g., copper) to an intended final line height thereof. The partial metal fill may be implemented entirely through chemical vapor deposition (CVD) processing or, alternatively, through a combination of a CVD initiation followed by a subsequent plating of the copper material. It will further be noted from FIG. 2(b) that the initially formed metal 208 is also present over the horizontal top surfaces of the insulating layer 202.

In the event that the level of metal 208 within the partially filled trench 204 is formed at a level higher than the desired final line height, an etch process can be used to recess the level of the metal 208 within the trench 204. In addition, the trench 204 may optionally be initially formed with rounded top edges so as to facilitate easier filling of the trench 204 with the copper fill material. Once the partial metal fill (to the final intended line height) is complete, a cap liner material 210 is deposited over the top of the metal line 208 in the trench 204, as reflected in block 106 of FIG. 1 and shown in FIG. 2(c). In an exemplary embodiment, the cap liner material 210 may be of the same material as is used for liner 206 (e.g., TaN, TiN, etc.). Due to the partial fill of the trench 204, it will be noted that the cap liner 210 also extends down into the trench 204. Thus, as indicted in block 108 of FIG. 1 and shown in FIG. 2(d), an additional sacrificial material (e.g., copper, dielectric material, etc.) 212 is formed over the top of the cap liner 210.

Figure 2E:
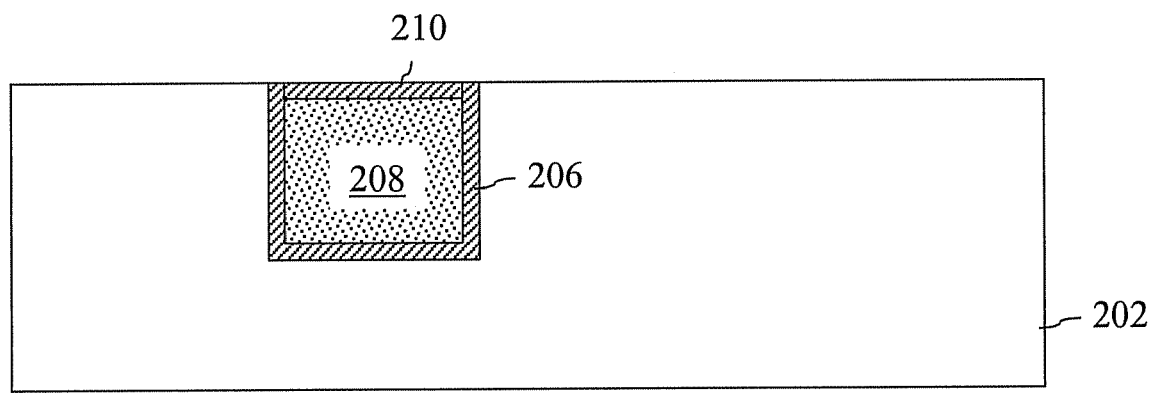

Finally, as indicated in block 110 of FIG. 1 and shown in FIG. 2(e), the device (including the metal overburden) is then planarized (e.g., by CMP) down to the level of the portion of the cap liner 210 atop the final line height of the metal 208. As a result, the cap liner 210 is defined after, not before, CMP processing of the associated metal level. In this manner, a dielectric cap layer (not shown) and/or a subsequent insulating layer for higher metal layers (not shown) can then be formed after CMP without the subsequent need for a selective cap liner applied to the top of metal 208. In other words, once CMP processing of the metal level is complete, the cap liner has been defined as a result.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for integrating cap liner formation in back-end-of-line (BEOL) processing of a semiconductor device, the method comprising:
    forming a trench within an insulating layer of the semiconductor device;
    depositing a first liner material over a top surface of the insulating layer, including sidewall and bottom surfaces of the trench;
    partially filling the trench with a wiring metal material, to a height corresponding to a final intended line height;
    depositing a second liner material over the wiring metal material;
    forming a sacrificial fill material over the second liner material; and
    planarizing the sacrificial fill material down to the level of the second liner material over the wiring metal material partially filling the trench, at the final intended line height, thereby completely removing the sacrificial fill material;
    wherein a remaining portion of the second liner material defines a cap liner of the wiring metal.

2. The method of claim 1, wherein the partial fill of the trench with the wiring metal material is implemented through chemical vapor deposition.

3. The method of claim 1, wherein the partial fill of the trench with the wiring metal material is implemented through a combination of chemical vapor deposition and plating.

4. The method of claim 1, wherein the wiring metal fill material and sacrificial fill material comprise copper.

5. The method of claim 1, wherein the first and second liner materials comprise one or more of tantalum, tantalum nitride and titanium nitride.

6. The method of claim 1, wherein the sacrificial fill material comprises copper, formed through one of: chemical vapor deposition and a combination of chemical vapor deposition and plating.

7. The method of claim 1, wherein a portion of the sacrificial fill material remains within the trench.

8. The method of claim 1, further comprising rounding edges of the trench prior to the partial filling thereof.

9. The method of claim 1, further comprising recessing a portion of the wiring metal material prior to depositing the second liner material.

10. The method of claim 1, further comprising partially planarizing the wiring metal material prior to depositing the second liner material.

11. A method for integrating cap liner formation in back-end-of-line (BEOL) processing of a semiconductor device, the method comprising:

forming a trench within an insulating layer of the semiconductor device;

depositing a first liner material over a top surface of the insulating layer, including sidewall and bottom surfaces of the trench;

partially filling the trench with a wiring metal material, to a height corresponding to a final intended line height, the wiring metal material also being formed over horizontal surfaces of the insulating layer above the trench;

depositing a second liner material over the wiring metal material;

forming a sacrificial fill material over the second liner material; and planarizing the sacrificial fill material down to the level of the second liner material over the wiring metal material partially filling the trench by chemical mechanical polishing (CMP), at the final intended line height, thereby completely removing the sacrificial fill material;

wherein a remaining portion of the second liner material following the CMP defines a cap liner of the wiring metal.

12. The method of claim 11, wherein the partial fill of the trench with the wiring metal material is implemented entirely through chemical vapor deposition.

13. The method of claim 11, wherein the partial fill of the trench with the wiring metal material is implemented through a combination of chemical vapor deposition and plating.

14. The method of claim 11, wherein the wiring metal fill material and sacrificial fill material comprise copper.

15. The method of claim 11, wherein the first and second liner materials comprise one or more of tantalum, tantalum nitride and titanium nitride.

16. The method of claim 11, wherein the sacrificial fill material comprises copper, formed through one of: chemical vapor deposition and a combination of chemical vapor deposition and plating.

17. The method of claim 11, wherein a portion of the sacrificial fill material remains within the trench.

18. The method of claim 11, further comprising rounding edges of the trench prior to the partial filling thereof.

19. The method of claim 11, further comprising recessing a portion of the wiring metal material prior to depositing the second liner material.

20. The method of claim 11, further comprising partially planarizing the wiring metal material prior to depositing the second liner material.

* * * * *